(12) United States Patent
Wu

(10) Patent No.: US 8,102,195 B2
(45) Date of Patent: Jan. 24, 2012

(54) DIGITAL PHASE-LOCKED LOOP CIRCUIT INCLUDING A PHASE DELAY QUANTIZER AND METHOD OF USE

(75) Inventor: I-chang Wu, Fremont, CA (US)

(73) Assignee: Mediatek Inc., Hsin-Chu (TW)

( * ) Notice: Subject to any disclaimer, the term of this patent is extended or adjusted under 35 U.S.C. 154(b) by 112 days.

(21) Appl. No.: 12/465,547

(22) Filed: May 13, 2009

(65) Prior Publication Data
US 2010/0289541 A1 Nov. 18, 2010

(51) Int. Cl.
*H03L 7/06* (2006.01)
(52) U.S. Cl. .......................... 327/156; 327/147
(58) Field of Classification Search ............ 327/147, 327/156
See application file for complete search history.

(56) References Cited

U.S. PATENT DOCUMENTS

| | | | | |
|---|---|---|---|---|
| 6,353,647 | B1 * | 3/2002 | Wilhelmsson et al. | 375/376 |
| 6,970,046 | B2 * | 11/2005 | Da Dalt et al. | 331/16 |
| 7,382,163 | B2 * | 6/2008 | Kuo et al. | 327/7 |
| 7,415,092 | B2 * | 8/2008 | Itri | 375/376 |
| 7,573,955 | B2 * | 8/2009 | Gazsi | 375/327 |
| 7,619,483 | B2 * | 11/2009 | van der Valk et al. | 331/18 |
| 7,642,862 | B2 * | 1/2010 | van der Valk et al. | 331/18 |
| 7,646,225 | B2 * | 1/2010 | Song et al. | 327/156 |
| 7,656,323 | B2 * | 2/2010 | Bereza et al. | 341/100 |
| 7,733,151 | B1 * | 6/2010 | Yu et al. | 327/291 |
| 2007/0030939 | A1 * | 2/2007 | Gazsi | 375/376 |
| 2008/0211588 | A1 * | 9/2008 | Frey et al. | 331/17 |
| 2008/0315921 | A1 * | 12/2008 | Cha et al. | 327/42 |
| 2009/0310730 | A1 * | 12/2009 | Zhidkov et al. | 375/376 |
| 2010/0013531 | A1 * | 1/2010 | Ainspan et al. | 327/159 |
| 2010/0013532 | A1 * | 1/2010 | Ainspan et al. | 327/159 |
| 2010/0073054 | A1 * | 3/2010 | Bereza et al. | 327/159 |
| 2010/0085220 | A1 * | 4/2010 | Zhang | 341/63 |
| 2010/0117742 | A1 * | 5/2010 | Da Dalt | 331/18 |
| 2010/0141310 | A1 * | 6/2010 | Yu et al. | 327/156 |
| 2010/0182049 | A1 * | 7/2010 | Sjoland | 327/7 |

OTHER PUBLICATIONS

Robert Bogdan Staszewski, et al., "All-Digital Phase-Domain TX Frequency Synthesizer for Bluetooth Radios in 0.13um CMOS," ISSCC Dig. Tech. Papers, pp. 272-273, Feb. 2004, 2004 IEEE International Solid-State Circuits Conference.

* cited by examiner

*Primary Examiner* — Lincoln Donovan
*Assistant Examiner* — Adam Houston
(74) *Attorney, Agent, or Firm* — Sawyer Law Group, P.C.

(57) ABSTRACT

A phase locked loop circuit in accordance with an embodiment implements a digital phase delay quantizer to replace the analog charge-pump and phase frequency detector in an analog PLL circuit. Therefore, the built-in loop filter can be a compact-sized, high order, high bandwidth, and high attenuation digital filter as well. The digital PLL circuit takes advantage of the deep sub-micron process technology which features high speed, high resolution, compact size, and low power.

5 Claims, 8 Drawing Sheets

DIGITAL PHASE-LOCKED LOOP CIRCUIT INCLUDING A PHASE DELAY QUANTIZER AND METHOD OF USE

FIELD OF THE INVENTION

The present invention relates generally to phase locked loop circuits, and more particularly to an apparatus for providing phase delays for such circuits.

BACKGROUND OF THE INVENTION

Phase locked loop (PLL) circuits are used in a variety of applications. FIG. 1 is a diagram of a conventional analog PLL circuit 100. The VCO frequency $f_{VCO}$ is divided by a frequency divider 112 to get the divided VCO frequency $f_{VCO}/N$. A flip-flop based phase frequency detector 104 compares a reference clock "$f_{ref}$", obtains the divided VCO frequency "$f_{VCO}/N$" and sends charge-up and charge-down signals to adjust the analog charge-pump 106. The charge-pump 106 adjusts the control voltage up or down based on the phase frequency detector 104 comparison results. The charge-pump 106 output voltage is low pass filtered by analog filter 108 and sent to the VCO 110 so as to tune the VCO frequency.

Conventional Analog PLL Circuit Function

In the conventional analog PLL circuit 100 shown in FIG. 1, the flip-flop based phase frequency detector 104 compares the frequencies of reference clock "$f_{ref}$" and the divided VCO frequency "$f_{VCO}/N$" to adjust the charge-pump circuit 106 so as to tune the VCO frequency.

FIG. 2 illustrates a slower VCO adjusted by the conventional analog PLL circuit 100. If the VCO frequency is slower than expected, the divided VCO frequency $f_{VCO}/N$ arrive later than the reference clock "$f_{ref}$". The phase frequency detector 104 sends a longer charge-up time signal and another shorter charge-down time signal to the analog charge-pump 106. Consequently, a positive net charge is delivered to the analog filter 108 from the charge-pump 106, which means the VCO 110 input control voltage goes up. Finally, a higher control voltage speeds up the VCO 110.

However, as device sizes become smaller such as in deep submicron technology, there are problems with this conventional analog design. Namely: (1) a relative large loop analog filter and (2) a low power supply headroom. The ways for overcoming these issues usually cause additional problems, which are described below.

1. Large loop filter size in analog PLL circuit solutions.

a) Provide a large built-in passive loop filter. The problem with this type of filter is that the filter dominates the silicon size and becomes problematic when utilized in the deep sub-micron process technology due to size conventions of the PLL circuit 100.

b) Provide a built-in active loop filter. The problem with this type of filter is that the filter consumes a large amount of power and also creates a large amount of noise.

c) Provide a large passive loop filter outside the chip. The problem with this type of filter is that the filter provides a low integration level and also adds a package interface noise interference component.

2. Low power supply headroom.

a) When using the above-identified topology in smaller process technologies, the tunable range, noise, and linearity performances are sacrificed due to the low voltage supply headroom of the analog charge-pump.

b) Another solution is to use auxiliary circuits to correct for the tuning range, noise, and linearity issues of the charge-pump. The problem with using auxiliary circuits is that the circuits increase the size, power, and complexity of the design; and also the auxiliary circuits may become the source of additional noise and non-linearity.

To address the above-identified issues, digital PLL circuits have been implemented. FIG. 3 illustrates one embodiment of a conventional digital PLL circuit 200 that attempts to address some of the above-identified issues related to analog PLL circuits.

The conventional digital PLL circuit 200 of FIG. 3 utilizes a Time-to-Digital converter (TDC) 205 to replace the analog charge-pump so that the other blocks can be implemented in digital. The digital PLL circuit 200 does not require a frequency divider. The DCO high frequency output is sent directly to the TDC to form a feedback loop.

There are several problems with the digital PLL circuit 100 which are described below.

1. The coarse resolution (one delay time of the inverter) of the TDC limits the phase noise and jitter performances.

2. The TDC limited length limits the PLL locking range.

3. The over-sampling design consumes huge power and limits the operating frequency of the DCO 210 (PLL output frequency).

Accordingly, what is needed is a system and method for addressing the above-identified issues.

The system and method should avoid using analog circuits that dominate the silicon size. In the new deep sub-micron process technologies, the sizes of analog circuits do not shrink as digital counterparts do. The non-shrunk analog circuit size implemented with expensive new technology will increase the cost of the chips. For example, the analog charge-pump and loop filter dominate the size of conventional PLL circuit.

The low power supply voltage of the deep sub-micron process technology suppresses the headroom of circuits. The low headroom issue degrades the performance of analog circuits. The interface between phase frequency detector and high voltage analog charge-pump in an analog PLL circuit has a voltage level shift issue as well, which degrades the linearity and noise performance. Accordingly, interfaces between analog devices and digital devices that degrade the performance should be minimized.

Accordingly, a system and method is needed to address the above-identified issues. The present invention addresses such a need.

SUMMARY

A digital phase locked loop circuit is disclosed. The digital phase locked loop circuit includes a reference clock generator for providing a reference clock signal and a digital filter for providing filtered digital codes. The circuit further includes a digital controlled oscillator coupled to the digital filter to receive the filtered digital codes and provide an output signal and a frequency divider coupled to receive the output signal and provide a frequency divided signal. Finally, the circuit includes a phase delay quantizer coupled to the frequency divider, reference clock generator and digital filter. The phase delay quantizer is operable to quantize a phase delay between the reference clock signal and the frequency divided signal and provides digital codes to the digital filter based upon the signals from the frequency divider and the reference clock generator. The phase delay quantizer quantizes the phase delay between the reference clock and the divided frequency signals without the use of oversampling.

A digital phase delay quantizer replaces the analog charge-pump and phase frequency detector in PLL circuits. Therefore, the built-in loop filter can be a compact-sized, high order, high bandwidth, and high attenuation digital filter as well. The digital phase locked loop circuit takes advantage of deep sub-micron process technology which features high speed, high resolution, compact size, and low power.

DETAILED DESCRIPTION OF PREFERRED EMBODIMENTS

The present invention relates to phase locked loop circuits and more particularly to an apparatus for providing phase delays for such circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A phase locked loop circuit in accordance with an embodiment implements a digital phase delay quantizer to replace the analog charge-pump and phase frequency detector in PLL. Therefore, the built-in loop filter can be a compact-sized, high order, high bandwidth, and high attenuation digital filter as well. This digital PLL circuit takes advantage of the deep sub-micron process technology which features high speed, high resolution, compact size, and low power. To describe the features of the digital PLL circuit in accordance with the present invention refer now to the following description in conjunction with the accompanying Figures.

Figure 1:
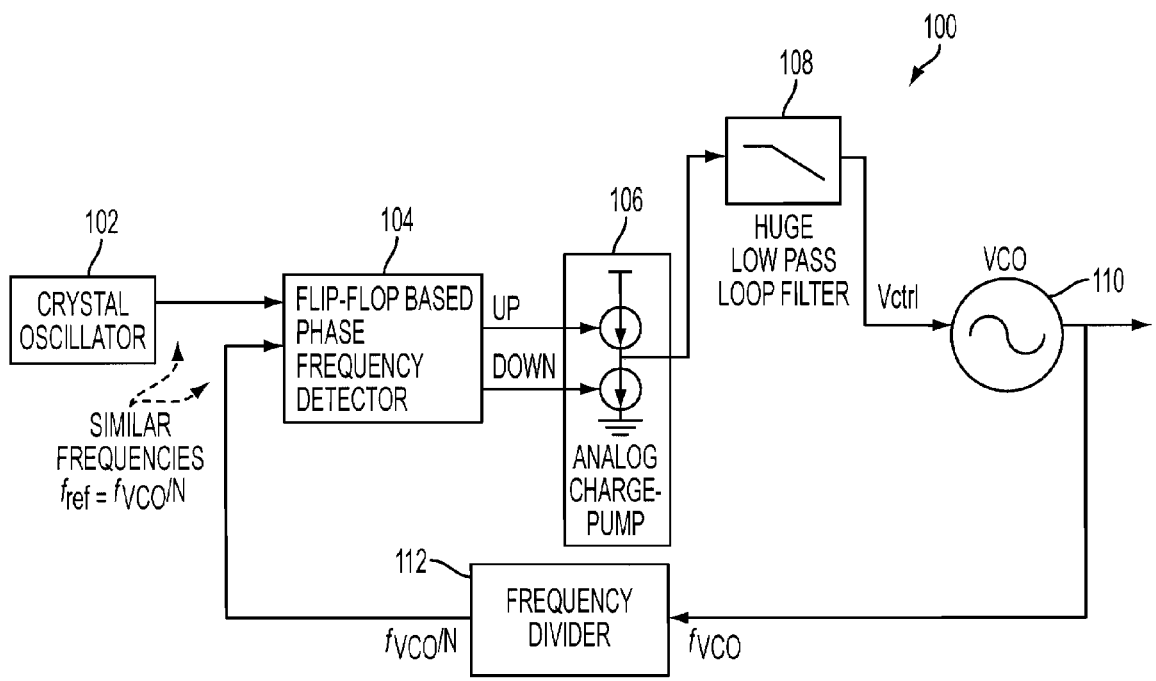
FIG. 1 illustrates a conventional analog PLL circuit.
Figure 2:
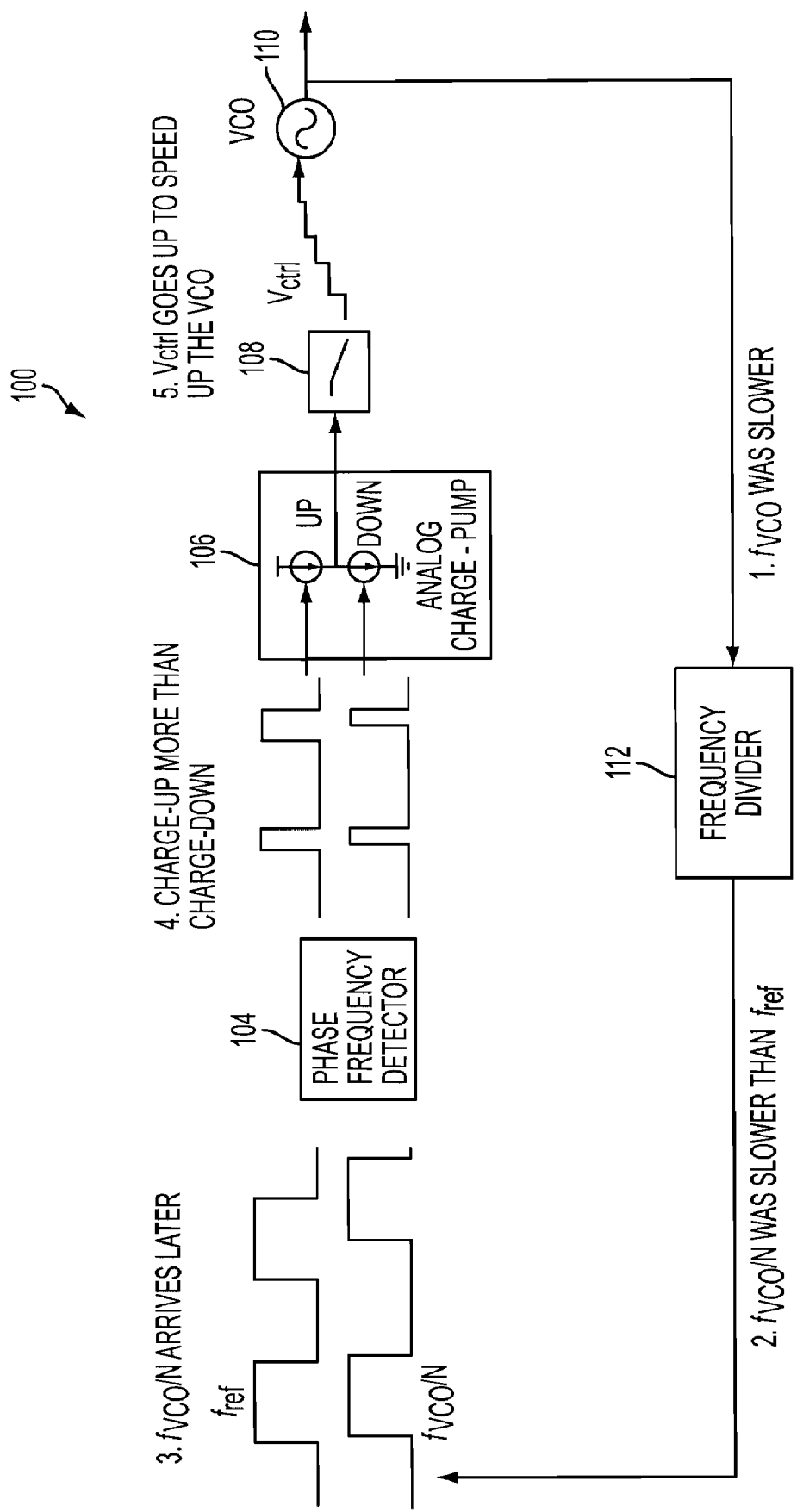
FIG. 2 illustrates a slower VCO adjusted by the conventional analog PLL circuit.
Figure 3:
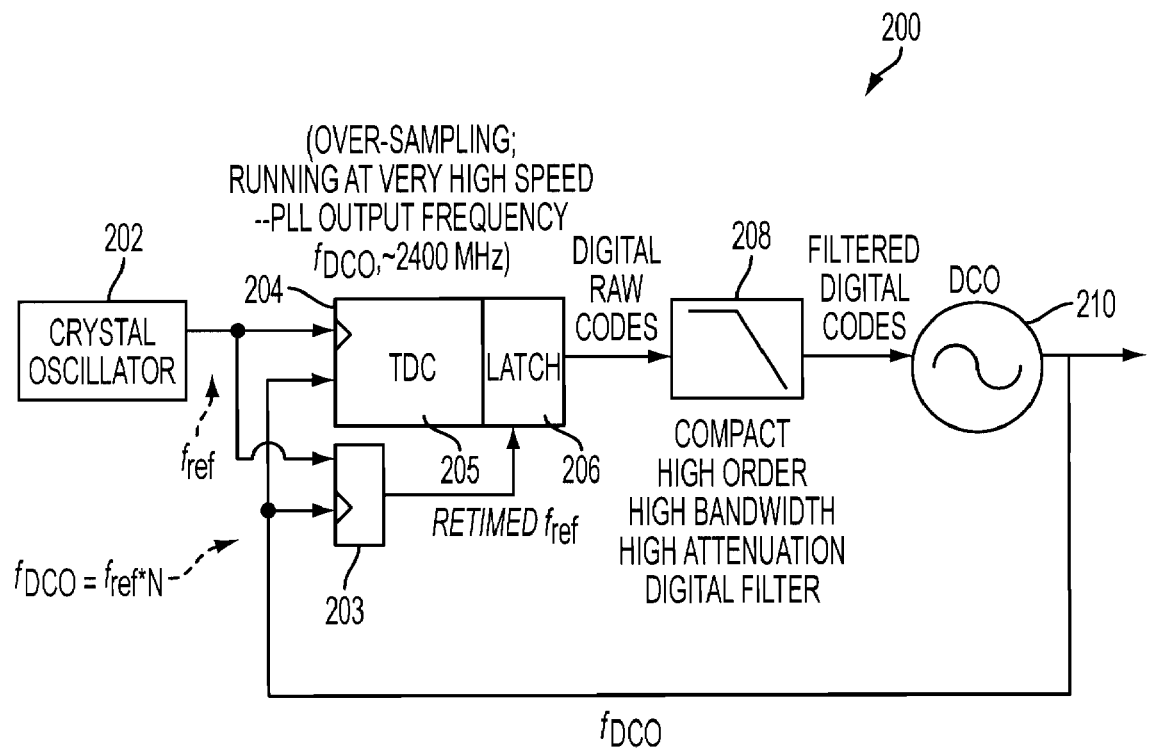
FIG. 3 illustrates one embodiment of a conventional digital PLL circuit.
Figure 4:
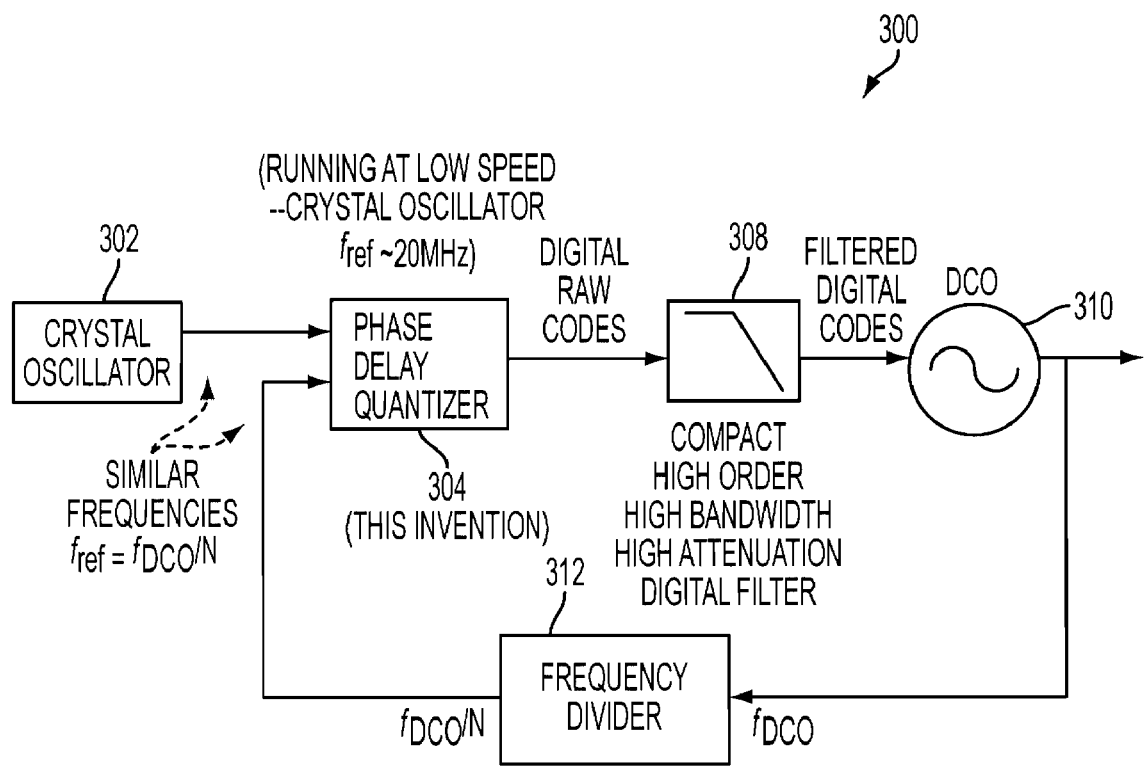
FIG. 4 is a block diagram of a digital PLL in accordance with an embodiment.

FIG. 4 is a block diagram of a digital PLL circuit 300 in accordance with an embodiment. Comparing the PLL circuit 300 with the conventional analog PLL circuit 100 shown in FIG. 1, the digital PLL circuit 300 utilizes a frequency divider 312, but it replaces the phase frequency detector and analog charge-pump with a digital phase delay quantizer 304, which quantizes the phase delay between the reference clock and the divided VCO frequency. The analog loop filter (either passive or active filter) is replaced by a compact high order, high bandwidth, and high attenuation digital filter 308 because the input of the filter is a plurality of output digital codes from the phase delay quantizer 304. Since the output of the filter 308 are digital codes, the voltage-controlled oscillator (VCO) of FIG. 1 is to be replaced by a digital-controlled oscillator (DCO) 310.

Figure 5:
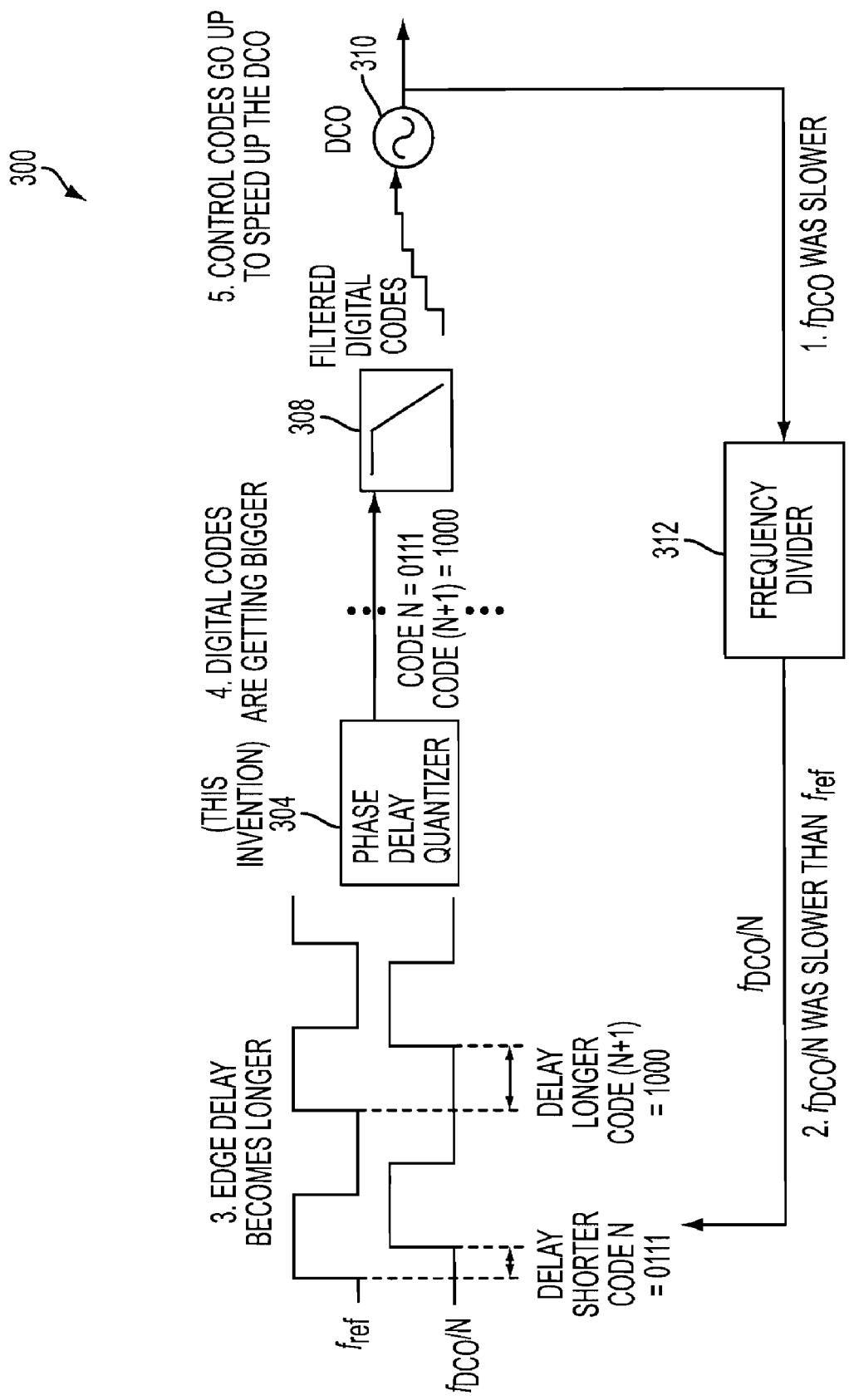
FIG. 5 illustrates a slower DCO adjusted by the PLL circuit of FIG. 4.

FIG. 5 illustrates a slower DCO 310 adjusted by the PLL circuit 300 of FIG. 4. The phase delay quantizer 304 is employed to count the delay time of the edges between reference clock and the divided DCO 310 frequency. If the DCO 310 frequency is slower than expected, the slower DCO 310 makes the divided DCO frequency $f_{DCO}/N$ arrive later than the reference clock "$f_{ref}$". The delay between the two edges is bigger, and the phase delay quantizer sends the larger code(s) to the digital filter. The larger digital input codes for DCO 310 will increase the frequency of the DCO 310.

Figure 6:
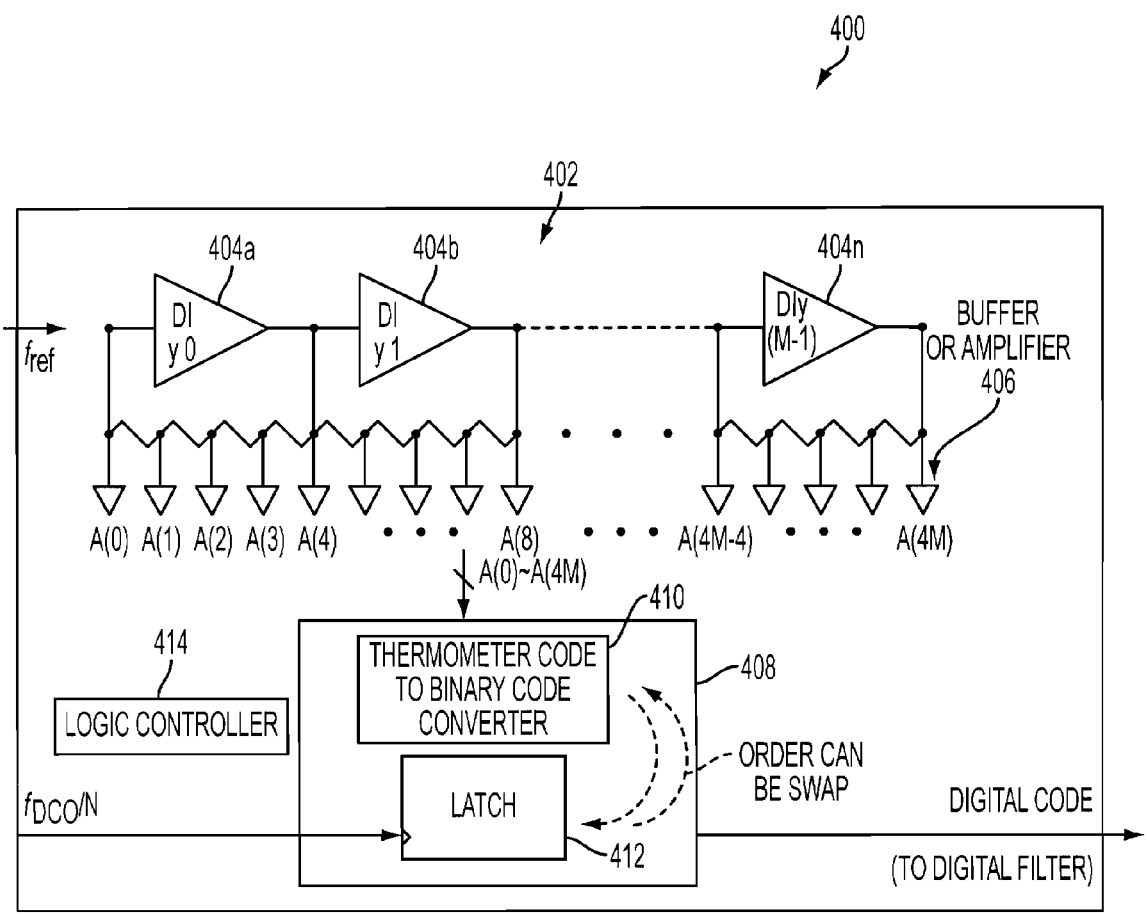
FIG. 6 illustrates the delay signal passing through each delay stage one time only in each "$f_{ref}$" initiating trigger.

To realize the function of the digital PLL circuit illustrated in FIG. 5, a long delay chain based phase delay quantizer 400 is shown in FIG. 6, which is a simple topology. The reference clock "$f_{ref}$" is sent to initiate the delay chain, and the divided DCO frequency $f_{DCO}/N$ arrives later to latch 412 the code that shows the propagation delay time between the two signal edges.

However, although this system has advantages over conventional PLL circuit, the delay chain needs to be very long to have a reasonable locking range, which will occupy a very large silicon area and consume more power than desired. These drawbacks can affect the ability to have compact and low power digital circuits in deep sub-micron technology.

In FIG. 6, the delay signal 404a-404n passes through each delay stage one time only in each "$f_{ref}$" initiating trigger.

Figure 7:
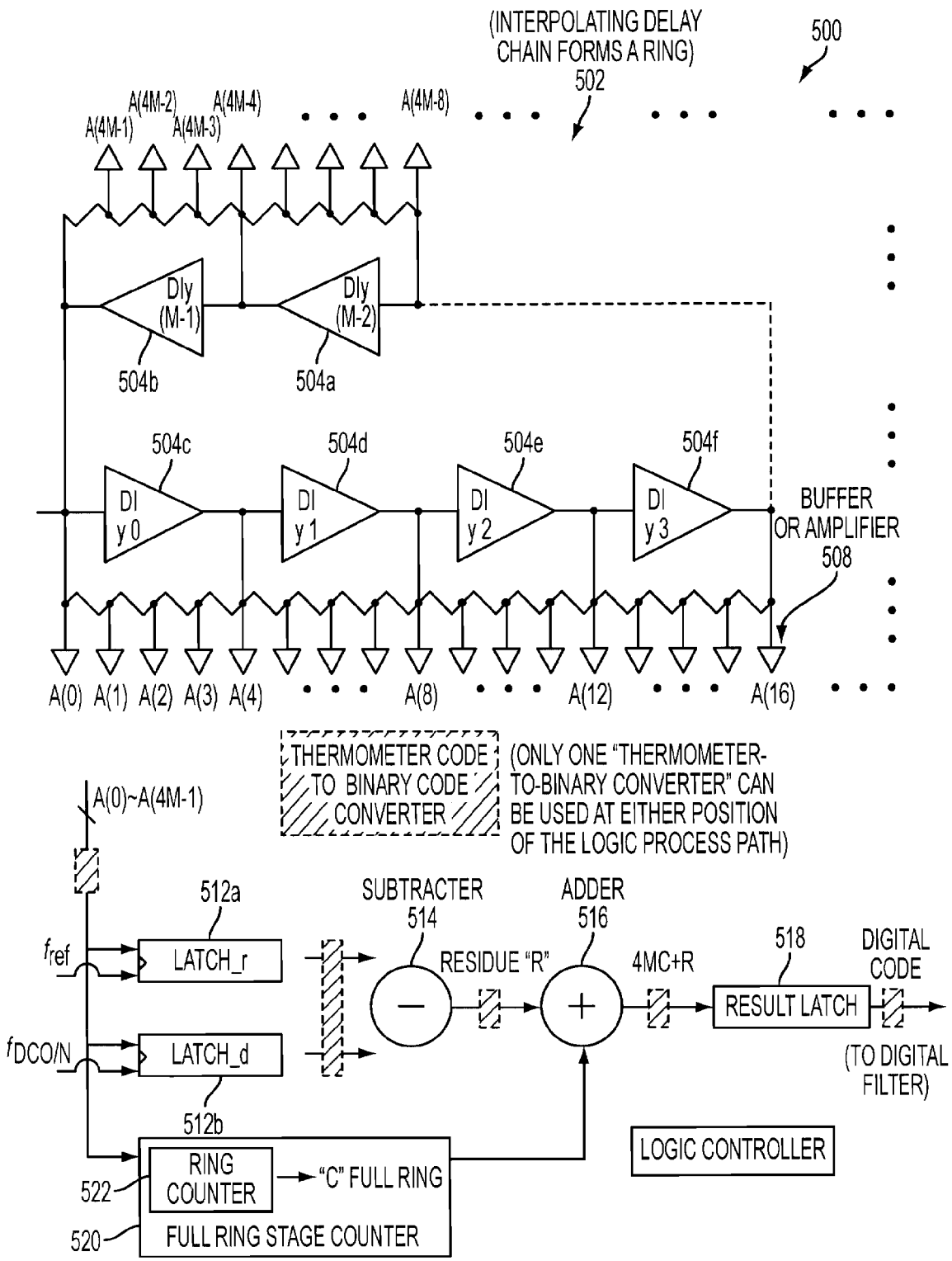
FIG. 7 is a diagram of an improved phase delay quantizer with a circular delay chain.
Figure 8:
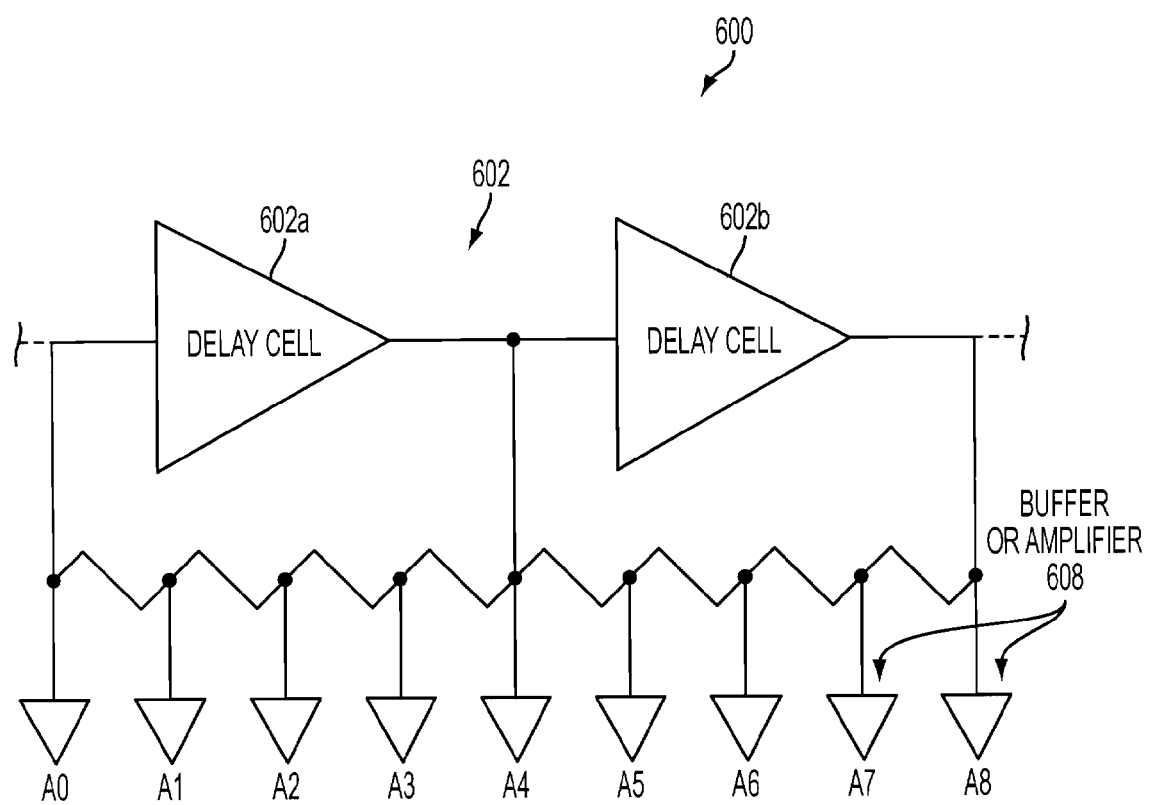
FIG. 8 illustrates an interpretation topology which is used to achieve a shorter delay than that of a gate delay time.

FIG. 7 is a diagram of a second embodiment delay quantizer 500 with the circular delay chain 504a-504f. FIG. 8 illustrates an interpolation topology which is used to achieve a shorter delay than that of a gate delay time.

To describe the features of FIGS. 7 and 8 refer now to the following description.

Delay ring 504a-504f (FIG. 7). To save the power consumption and physical silicon size, the long delay chain was modified to form a ring 504a-504f. Instead of counting the long delay with a very huge chain, this circular concept can dramatically reduce power consumption and circuit size. Hence, the delay stages can be reused, the size and power consumption can be dramatically reduced. The digital process will count the delay between the two edges.

Interpolating delay stages 600 (FIG. 8). To realize the fine resolution, an interpolation topology 600 (FIG. 8) is used to achieve a shorter delay than that of a gate delay time. For example, a digital stage delay is about 15 ps in 90 nm process. If the digital delay buffer can be divided into 4 sub-stages with interpolation structure, the delay time can be smaller than 4 ps so as to achieve the desired resolution for a high performance PLL circuit. The number of interpolated sub-stages does not need to be 4; it can be any reasonable number (2, 3, 4, 5, 6, 7, 8 . . . ).

Code subtractor 514. The reference and divided VCO signals trigger their individual latch 512 respectively to record the time their edge arrives. A subtractor 514 subtracts these two codes so that it can determine the delay time between the two edges as shown in FIG. 7. The subtracted code "R" represents the interpolated stage delays in a non-full ring circle.

Ring counter 522. If the two edge delay time is longer than that of M buffer stages, a ring counter 522 is used to memorize how many full rings 520 are running between them as shown in FIG. 7. The full ring number "C" means that there are 4M*C interpolated stage delays.

Final code adder 516. The number of full rings 520 and the fractional part of the ring are summarized by a final code adder 516.

In the example shown in FIG. 7, there are M delay cells (4M interpolated stages). For example, $f_{ref}$ triggers latch "Latch_r" 512a to latch the code A(8), and after another 70 full ring delay, $f_{DCO}/N$ triggers latch "Latch_d" 512b to latch the code A(15). The subtractor 514 counts the residue R=15−8=7. Therefore, the delay time between them is known as 4M*C+R=(4M*70+15−8)*Δt=(208M+7)*Δt=(70M+7/4)
*Δt$_{cell}$=(70M+1+3/4)*Δt$_{cell}$, where the Δt$_{cell}$ is the delay time of the delay cell and the Δt is the interpolated stage delay time (Δt=Δt$_{cell}$/4 in this example).

From the above example, the benefits are obvious from the above described topologies of the phase delay quantizer 500.

(1) Due to the interpolating structure, the fine resolution is realized with the fractional delay time on the delay cell.

(a) Without interpolation: If M is 16 and Δt$_{cell}$ is 16 ps, the system knows the edge difference is between (16×70+1)×16 ps=1121×16 ps=17.936 ns and (16×70+2)×16 ps=1122×16 ps=17.952 ns. Resolution is 16 ps.

(b) With interpolation: If M is 16 and Δt is 4 ps, the system knows the edge difference is between (4×16×70+7)×4 ps=4487×4 ps=17.948 ns and (4×16×70+8)×4 ps=4488×4 ps=17.952 ns. Resolution is 4 ps, which is more precise than the non-interpolating design.

(2) Due to the ring structure, compact size and lower power, the phase delay quantizer 500 is realized with a circular delay ring.

(a) In this embodiment 16 delay cells are utilized instead of 1122 delay cells that would be required without the use of a ring. If a larger locking range is desired, thousands of delay cells are required in a chain structure. However, the number of delay cells are fixed when using a circular ring structure.

Alternative Embodiments

In FIG. 5, it is assumed that the K$_{DCO}$ is proportional to the digital code value (larger digital code make it faster). If the K$_{DCO}$ is reverse proportional to the digital code value (smaller digital code make it faster), either one of the following adjustment can keep the negative feedback loop stable: (a) swap the two input of phase delay quantizer; (b) swap the two inputs of the subtracter in the phase delay quantizer; (c) modify the digital loop filter; and (d) modify the DCO decoder.

The interpolating delay chain in FIG. 6 and the interpolating delay ring in FIG. 7 respectively can be either (a) single-ended design, (b) differential design, or (c) complement design.

In FIG. 7, the logic process is a conceptual graph. Some conceptual blocks can be implemented in a circuit. (a) The buffer or amplifier and latch_r/latch_d can be integrated together (buffer or amplifier has the latch function); (b) the latch_r/latch_d and subtracter can be integrated together (substracter has the latch function); (c) the subtracter and adder can be integrated together (3 input adder); (d) the adder and the result latch can be integrated together (adder has the latch function); (e) the ring counter and the full ring stage counter can be integrated together; (f) the full ring stage counter and adder can be integrated together, and (g) the thermometer code to binary code converter can be neglected if the digital filter can take the thermometer code.

(h) The thermometer code to binary code converter can be placed at either one of the digital logic process path: (i) between buffer/amplifier and latch; (ii) between latch and subtracter; (iii) between subtracter and adder; (iv) between adder and result latch; (v) between result latch and digital filter and (vi) between digital filter and DCO.

Advantages

1. Compared with the conventional analog PLL circuit (FIG. 1): a high order digital loop filter which follows the proposed digital implemented phase delay quantizer instead of the conventional analog charge-pump and the phase frequency detector offers many advantages, such as compact size, high-integrated level, and sharp noise attenuation. Other advantages are described in detail below.

(a) Fine resolution (because of interpolated delay stages). Unlike the TDC (time-to-digital converter), the proposed phase delay quantizer uses interpolating design to achieve fine resolution so as to pursue low phase noise, low jitter, and high linearity of the PLL performance.

(b) Large locking range with small size and lower power quantizer due to circular concept. Unlike the TDC (time-to-digital converter), the interpolating delay chain in the phase delay quantizer forms a ring so that the delay stages can be reused. This circular ring dramatically reduces the size and power consumption of the delay chains; in addition, it offers unlimited locking range in theory.

(c) High operating frequency, and high performance with small size and lower power digital blocks (because of the low comparison rate). Unlike the TDC (time-to-digital converter), the proposed phase delay quantizer is not an over-sampling design. Only the first stage of frequency divider is running at the DCO output frequency, which relaxes the speeding requirement of digital blocks; consequently, the size and power consumption of the digital blocks (including the proposed phase delay quantizer) are relaxed as well. The heritage of the relaxed design makes the system generate less non-linear distortion, less jitter, and less phase noise so as to achieve better performance. Also, this relaxed design has the potential to reach higher operating frequency than the conventional TDC-based digital PLL circuit.

The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

What is claimed is:

1. A digital phase locked loop circuit comprising:
a reference clock generator for providing a reference clock signal;
a digital filter for providing filtered digital codes;
a digital controlled oscillator coupled to the digital filter to receive the filtered digital codes and provide an output signal;
a frequency divider coupled to receive the output signal and provide a frequency divided signal; and
a phase delay quantizer coupled to the frequency divider, reference clock generator and digital filter; the phase delay quantizer operable to quantize a phase delay and between the reference clock signal and the frequency divided and to provide digital codes to the digital filter based upon signals from the frequency divider and the reference clock generator, wherein the phase delay quantizer quantizes the phase delay between the reference clock and the divided frequency signals without the use of oversampling, wherein the phase delay quantizer comprises a plurality of interpolated delay stages, wherein an interpolated delay chain in the phase delay quantizer forms a circular ring so that the delay stages can be reused.

2. The digital phase locked loop circuit of claim 1 wherein the reference clock generator comprises a crystal oscillator.

3. The digital phase locked loop of claim 1 wherein the phase delay quantizer comprises a plurality of interpolated delay stages to achieve a shorter delay time than a gate delay.

4. The digital phase locked loop of claim 3 wherein the phase delay quantizer includes a code subtractor to subtract codes generated by the reference clock signal and the frequency divided signal to quantize the delay time between edges of the signals.

5. The digital phase locked loop of claim 3 wherein the phase delay quantizer includes a ring counter to memorize the number of full rings that are running between buffer stages in the digital phase locked loop circuit.

* * * * *